United States Patent
Rieschl et al.

(10) Patent No.: US 9,624,572 B2
(45) Date of Patent: Apr. 18, 2017

(54) METHOD OF HIPIMS SPUTTERING AND HIPIMS SPUTTER SYSTEM

(71) Applicant: Evatec AG, Trubbach (CH)

(72) Inventors: Sven Uwe Rieschl, Malans (CH); Juergen Weichart, Balzers (LI)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 14/765,975

(22) PCT Filed: Feb. 7, 2014

(86) PCT No.: PCT/EP2014/052402
§ 371 (c)(1),
(2) Date: Aug. 5, 2015

(87) PCT Pub. No.: WO2014/122250
PCT Pub. Date: Aug. 14, 2014

(65) Prior Publication Data
US 2015/0368792 A1     Dec. 24, 2015

Related U.S. Application Data

(60) Provisional application No. 61/762,439, filed on Feb. 8, 2013.

(51) Int. Cl.
*C23C 14/35* (2006.01)
*H01J 37/34* (2006.01)
*C23C 14/34* (2006.01)

(52) U.S. Cl.
CPC ........ *C23C 14/351* (2013.01); *C23C 14/3485* (2013.01); *C23C 14/3492* (2013.01); *H01J 37/3455* (2013.01); *H01J 37/3467* (2013.01)

(58) Field of Classification Search
CPC .............. H01J 37/3455; H01J 37/3467; C23C 14/3485; C23C 14/3492; C23C 14/35; C23C 14/351
(Continued)

(56) References Cited

U.S. PATENT DOCUMENTS 5,171,415 A    12/1992   Miller
5,833,815 A    11/1998   Kim
(Continued)

FOREIGN PATENT DOCUMENTS

DE     39 08 252 A1    9/1990
EP      0 945 524 A1    9/1999
(Continued)

OTHER PUBLICATIONS

Reed et al. "Pressure effects on HiPIMS deposition of hafnium films", Surface & Coatings Technology (206) Mar. 2012, 3795-3802.*
(Continued)

*Primary Examiner* — Rodney McDonald
(74) *Attorney, Agent, or Firm* — Pearne & Gordon LLP

(57) ABSTRACT

So as to control the operation of a sputter target (9) during lifetime of the target and under HIPIMS operation part (I) of a magnet arrangement associated to the target (9) is retracted from the target (9) whereas a second part II of the magnet arrangement is, if at all, retracted less from the addressed backside (7) during lifetime of the target (9). Thereby, part I is closer to the periphery of target (9) than part II, as both are eccentrically rotated about a rotational axis (A).

21 Claims, 6 Drawing Sheets

Figure 1:
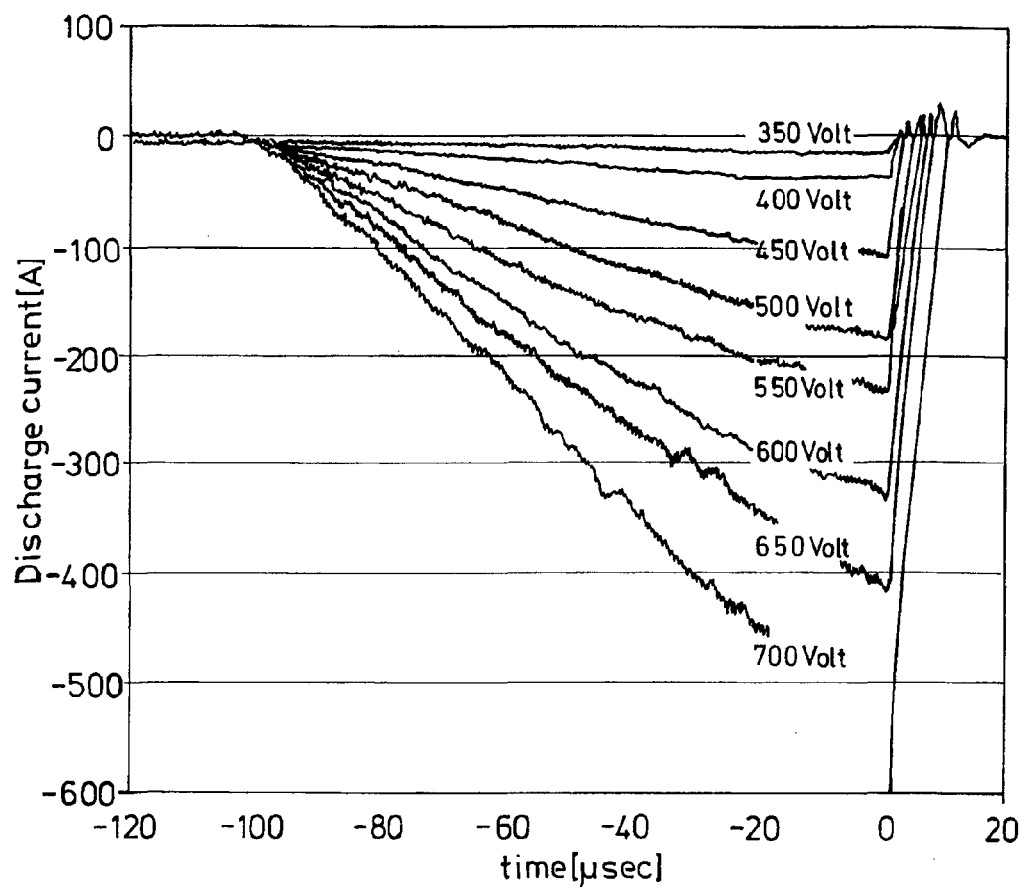

(58) Field of Classification Search
USPC .............. 204/192.12, 298.2, 298.03, 298.29, 204/192.13
See application file for complete search history.

(56) References Cited

U.S. PATENT DOCUMENTS

| | | |
|---|---|---|
| 6,821,397 B2 | 11/2004 | Krassnitzer |
| 2004/0050690 A1 | 3/2004 | Green |
| 2006/0065525 A1* | 3/2006 | Weichart ................ C23C 14/35 204/298.28 |
| 2009/0205949 A1 | 8/2009 | Zueger |
| 2009/0229970 A1 | 9/2009 | Itagaki |
| 2010/0236919 A1* | 9/2010 | Alami .................... C23C 14/35 204/192.12 |
| 2011/0259733 A1 | 10/2011 | Watanabe |
| 2012/0073965 A1 | 3/2012 | Pei |

FOREIGN PATENT DOCUMENTS

| | | |
|---|---|---|
| EP | 1 908 090 | 4/2008 |
| JP | 2001-158961 A | 6/2001 |
| WO | 01/63643 A1 | 8/2001 |
| WO | 2006/034598 A1 | 4/2006 |

OTHER PUBLICATIONS

International Search Report for PCT/EP2014/052402 dated May 2, 2014.
Written Opinion for PCT/EP2014/052402 dated May 2, 2014.

\* cited by examiner

METHOD OF HIPIMS SPUTTERING AND HIPIMS SPUTTER SYSTEM

The present invention is directed to a method of sputter coating, especially of HIPIMS sputter coating substrates and to a HIPIMS sputter system.

DEFINITIONS

Processing in the sense of this invention includes any chemical, physical or mechanical effect acting on substrates.

Substrates in the sense of this invention are components, parts or workpieces to be treated in a processing apparatus. Substrates include but are not limited to flat, plate shaped parts having rectangular, square or circular shape. In a preferred embodiment this invention addresses essentially planar, circular substrates, such as semiconductor wafers.

A vacuum processing or vacuum treatment system or apparatus comprises at least an enclosure for substrates to be treated under pressures lower than ambient atmospheric pressure.

CVD or Chemical Vapour Deposition is a chemical process allowing for the deposition of layers on heated substrates. One or more volatile precursor material(s) are being fed to a process system where they react and/or decompose on the substrate surface to produce the desired deposit. Variants of CVD include: Low-pressure CVD (LPCVD)—CVD processes at sub-atmospheric pressures, Ultrahigh vacuum CVD (UHVCVD)—CVD processes typically below $10^{-6}$ Pa/$10^{-7}$ Pa, Plasma methods like Microwave plasma-assisted CVD (MPCVD), Plasma-Enhanced CVD (PECVD)—CVD processes that utilize plasma to enhance chemical reaction rates of the precursors.

Physical vapor deposition (PVD) is a general term used to describe any of a variety of methods to deposit thin films by the condensation of a vaporized form of a material onto a surface of a substrate (e.g. onto semiconductor wafers). The coating method involves purely physical processes such as high temperature vacuum evaporation or plasma sputter bombardment in contrast to CVD. Variants of PVD include Cathodic Arc Deposition, Electron beam physical vapor deposition, Evaporative deposition, Sputter deposition (i.e. a glow plasma discharge usually confined in a magnetic tunnel located on a surface of a target material, in that case also called magnetron sputtering.).

The terms layer, coating, deposit and film are interchangeably used in this disclosure for a film deposited in vacuum processing equipment, be it CVD, LPCVD, plasma enhanced CVD (PECVD) or PVD (physical vapour deposition)

TECHNICAL BACKGROUND

The use of PVD deposition technology for the processing of substrates in a vacuum treatment system is widely known. In such a system designed for magnetron sputter deposition it is known to arrange a magnet system behind a sputtering target to define a magnetic tunnel located on a surface of a target material, the sputtering surface, the tunnel confining the plasma during operation. Over the target's lifetime the erosion of the target caused by magnetron sputtering results in the formation of a so called racetrack, a trench in the target material. If the trench has consumed the thickness of the target, the target needs to be exchanged; this also defines for the target-lifetime.

In order to allow for better exploitation of the target material as well as improving the deposition homogeneity on the substrate it is known to move the magnet system during operation of the deposition process. This can be realised mechanically (rotating, shifting the magnet system in part or as a whole) or electrically by using coils modulating the location and/or strength of the magnetic field.

Several concepts have been proposed to achieve erosion-uniformity of the target over target life in rotating magnetron sputtering systems, these include concepts with lateral magnet movement like in U.S. Pat. No. 6,821,397 B2, WO0163643A1, U.S. Ser. No. 05/171,415_A, U.S. Ser. No. 05/833,815_A, US_20040050690_A1 and others, as well as concepts with axial magnet movement, like in DE_03908252_A1, EP_00945524_A1 and EP_01908090_B1.

DISADVANTAGES OF THE PRIOR ART

As mentioned, over target life erosion grooves on the sputtering surface of the sputtered target are formed. The erosion pattern may consist of an outer main erosion groove and one or more weaker inner erosion grooves towards the centre of the target. The outer main erosion groove is required for a good deposition uniformity to cope with the limited target diameter. The smaller the target diameter in relation to the substrate diameter is the more pronounced the outer erosion groove has to be so as to compensate the edge effect. Since thus during target life erosion will specifically affect the outer main groove, consequently the influence of the magnetic field is getting stronger in this location due to the fact, that there the target becomes thinner and thinner. As a result the discharge current rises and the voltage decreases for a fixed discharge power. Usually a sputter deposition system's control system runs a user-defined program or recipe and allows adjusting either the deposition time or the discharge power to get the same film thickness throughout the entire target life. In many applications a change of the voltage/current ratio is of no problem since the rate is defined by the discharge power. In some set-ups the uniformity can be adjusted over target life by lateral magnet movement, like it is described in U.S. Pat. No. 6,821,397 B2.

However in several other applications the increasing magnetic field significantly changes the process conditions. One example is the sputtering of ferromagnetic materials, where the magnetic field strongly increases due to thinning of the target.

Another application is sputtering with pulsed DC with very high currents and low duty cycles, also known as HIPIMS or HPPMS. Here typically current pulses with durations in the range of 50 to 300 μsec are used. While the voltage can be applied instantaneously the current rise is depending on several parameters like the output quality of the pulsing supply-unit, the chamber impedance, the magnetic field, the cable and the target voltage. If the target voltage changes due to target erosion and the magnetic field changes, it may get difficult to enable a stable HIPIMS process over the entire target life.

FIG. 1 shows by example the significant change of the current rise and the pulse peak value as a function of the applied target voltage with a 100 μsec pulse on a Ti target with otherwise unchanged conditions.

The power of a single pulse is given by:

$P\text{ pulse} = \int U(t)*I(t)*dt$

Due to the highly dynamic situation of the pulsing as illustrated in FIG. 1 it is obvious that the pulse power may experience significant changes from start to end of target life. However it has to be noted that in particular the HIPIMS process requires a constant peak current over target life, since it is the peak current that is directly correlated with the ionization degree of the discharge and the ionization degree itself is the driving parameter to enable via filling in deep features (see: Society of Vacuum Coaters 505/856-7188, 52nd Annual Technical Conference Proceedings, Santa Clara, Calif., May 9-14, 2009 ISSN 0737-5921).

In standard DC sputtering there are several methods existing to control a constant film thickness and uniformity over target life. Film thickness control can be done by adjustment of the sputter power over target life or by adjustment of the process time. Usually the sputter power or the process time have to be increased since by the target erosion the target surface moves "away" from the substrate resulting in an effectively higher target to substrate distance. Additionally in a standard DC sputtering system, due to erosion, the magnetic field driving the plasma increases, which results in an increasing target current and in a decreasing target voltage. For many applications the current/voltage ratio is not of importance. However especially for highly dynamic pulsed processes like HIPIMS voltage and current needs to be kept constant during target life for the following reasons:

1. The current rise strongly depends on the target voltage as plotted in FIG. 1. For a fixed pulse length this affects the power in the pulse.
2. The current pulse peak value is, as was addressed, a key parameter to achieve metal ionization by HIPIMS in the metallization of deep vias. It needs to be kept constant during target life. The current pulse peak value has to be as high as possible, but it has to stay below that limit of the pulse supply where an arc is detected.

Figure 2:
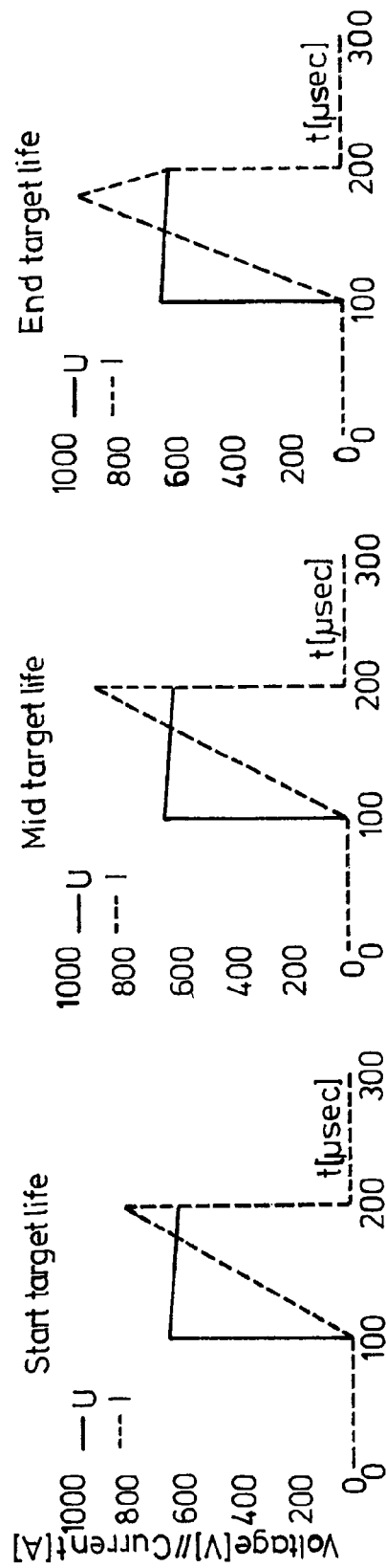

One example of the evolution of the pulse shapes and of current pulse peak values of 100 μsec pulses over target life is plotted schematically in FIG. 2. It might be seen that for the target voltage being kept constant the current peak value is increasing due to the increasing magnetic field. The last picture shows that the current shuts off due to approaching the arc level, which is sensed by current-sensing. It is obvious that the whole series does not provides for a constant current pulse peak value and for constant pulse power P pulse.

SUMMARY OF THE INVENTION

The problems as addressed above are resolved according to the present invention by a method of HIPIMS sputter coating substrates comprising:
- providing a target with a sputtering surface and with a back surface
- providing along the back surface a magnet arrangement
- pivoting or rotating the magnet arrangement about a rotational axis which is perpendicular to the back surface of the target.
- the magnet arrangement comprises magnet poles which are arranged along a pair of closed loops. An outer of the addressed closed loops of the pair completely surrounds an inner of the addressed closed loops of the pair and is distant from the inner of the addressed closed loops.
- the magnet poles which face the backside of the target and which are arranged along one of the addressed closed loops of the pair have opposite magnet polarity with respect to the magnet poles facing the addressed backside of the target which are arranged along the other of the addressed closed loops of the pair.
- the pair of closed loops is subdivided in a first part and in a second part. The outer closed loop of the pair is thereby subdivided in a first outer section in the addressed first part and in a second outer section in the addressed second part of the pair. The addressed inner closed loop on its side is thereby subdivided in a first inner section in the first part and in a second inner section in the second part.
- the first outer section of the outer closed loop is more distant from the rotational axis than the second outer section of the outer closed loop, both considered in radial direction with respect to the rotation axis.
- the distances of at least a predominant number of magnet poles along at least one of the outer and of the inner first sections, both in the first part, are controllably increased with respect to the backside of the target more, than the distances to the addressed backside of at least a predominant number of magnet poles of the outer and of the inner second sections, both in the second part, being increased, as HIPIMS operation time of the addressed one target increases.

In one embodiment of the method according to the invention, which may be combined with any embodiment still to be addressed, unless in contradiction, performing controllably increasing of distances of the at least predominant number of magnet poles along at least one of the outer and of the inner first sections is done in a manner so as to maintain peak current pulse values of the HIPIMS operation at least approx. constant over lifetime of the target.

In one embodiment of the method according to the invention, which may be combined with any of the already addressed and the subsequently addressed embodiments, unless in contraction, the magnet arrangement comprises a single pair of the addressed closed loops.

In one embodiment of the method according to the invention, which may be combined with any of the preaddressed and of the subsequently addressed embodiments of the method, unless in contradiction, the distances to the backside of the at least predominant number of magnet poles of the outer and of the inner second section, both in the second part, are increased by an equal movement from the backside and parallel to the rotational axis. This means that even if the initial distances from the backside of the addressed magnet poles are different, the respective distances are increased by the addressed equal movement equally.

In a further embodiment of the invention, which may be combined with any of the preaddressed embodiments and embodiments still to be addressed of the method, unless in contradiction, the distances to the backside of the at least predominant number of magnet poles of the outer and of the inner second sections, in the second part, are kept constant during HIPIMS operation time of the target i.e. during lifetime of the target.

In a further embodiment of the method according to the invention, which may be combined with any of the preaddressed embodiments and embodiments still to be addressed, unless in contradiction, the distances of the at least predominant number of magnet poles of the outer and of the inner second sections are equal during HIPIMS operation time of the target.

In a further embodiment of the method according to the invention, which may be combined with any of the preaddressed embodiments and of the embodiments still to be addressed, unless in contradiction, controllably increasing the distances of the at least predominant number of magnet poles along at least one of the outer and of the inner first sections, in the first part, to the backside is performed upon magnet poles along the outer as well as upon magnet poles along the inner first sections.

In a further embodiment of the method, which may be combined with any of the preaddressed embodiments and embodiments still to be addressed, unless in contradiction, the distances of the at least predominant number of magnet poles along at least one of the outer and of the inner first sections are equally increased.

In a further embodiment of the method according to the invention, which may be combined with any of the preaddressed embodiments and embodiments still to be addressed, unless in contradiction, the distances to the backside of the at least predominant number of magnet poles of the at least one of the outer and of the inner first sections are increased by an equal movement considered in direction from said backside and parallel to said rotational axis.

In a further embodiment of the method according to the invention, which may be combined with any of the preaddressed embodiments and embodiments still to be addressed, unless in contradiction, the distances to the backside of the at least predominant number of magnet poles of the at least one of the outer and of the inner first section are equal during HIPIMS operation time of the target.

In a further embodiment of the method according to the invention, which may be combined with any preaddressed embodiment and embodiment still to be addressed, unless in contradiction, the distances of magnet poles along the outer and inner first section are equal during HIPIMS operation time of the target and wherein distances from magnet poles along the outer and the inner second section are equal as well during the addressed HIPIMS operation time of the target.

In a further embodiment of the method according to the invention, which may be combined with any of the preaddressed embodiments and embodiments still to be addressed, unless in contradiction, an average distance from the rotational axis of the magnet poles along the first outer section is larger than an average distance from said rotational axis of magnet poles along the second outer section.

In a further embodiment of the method according to the invention, which may be combined with any of the preaddressed embodiments and embodiments still to be addressed, unless in contradiction, the distances of all magnet poles along at least one of the outer and of the inner first sections to the backside are controllably increased.

In a further embodiment of the just addressed embodiment of the method, the distances of the magnet poles along the outer as well as along the inner first sections to the backside are controllably increased.

In a further embodiment of the method according to the invention, which may be combined with any embodiment preaddressed and embodiment still to be addressed, unless in contradiction, at least one first locus along the outer first section defines for a maximum distance $R_{max}$ from the rotational axis and wherein at least one second locus along the outer second section defines for a minimum distance $R_{min}$ from said rotation axis and wherein the first part is limited on one side of the first locus by a first limit locus which has a distance $R_{e1}$ from the addressed rotational axis which is not less than $$R_{e1}=(R_{max}+R_{min})/2$$

and wherein further the first part is limited on the other side of the first locus by a second limit locus with a distance $R_{e2}$ from the rotational axis which is not less than $$R_{e2}=(R_{max}+R_{min})/2.$$

In a further embodiment of the method according to the invention, which may be combined with any of the preaddressed embodiments and embodiments still to be addressed, unless in contradiction, controllably increasing the distances of the at least predominant number of magnet poles along at least one of the outer and of the inner first sections to the backside is performed at least one of stepwise and of steadily during the HIPIMS operation time of the target.

In a further embodiment of the method according to the invention, which may be combined with any of the preaddressed embodiments and embodiments still to be addressed, unless in contradiction, controllably increasing the distances of the at least predominant number of magnet poles along the at least one of the outer and of the inner first sections is performed in dependency of erosion depths of the sputtering surface adjacent to the periphery of the target and is thereby, in a further good embodiment, selected approx. equal to the erosion depth of the sputtering surface adjacent to the periphery of the target.

In a further embodiment of the method according to the invention, which may be combined with any of the preaddressed embodiments and embodiments still to be addressed, unless in contradiction, controllably increasing the distances of the at least predominant number of magnet poles along the at least one of the outer and of the inner first sections is controlled by a predetermined distance vs. time characteristic.

In a further embodiment of the method according to the invention, which may be combined with any of the preaddressed embodiments and embodiments still to be addressed, unless in contradiction, the magnet poles are magnet poles of magnets arranged with their dipole direction at least substantially parallel to the rotational axis.

The addressed problems are further resolved by a HIPIMS sputter system which comprises a target arrangement with a sputtering surface and with a back surface. The system further comprises a magnet arrangement along the back surface of the target arrangement and a pivoting or rotating drive which is operationally connected to the magnet arrangement so as to pivot or rotate the magnet arrangement about a rotational axis perpendicular to the back surface of the target arrangement. The magnet arrangement comprises magnet poles arranged along a pair of closed loops, an outer of the closed loops of the pair completely surrounding an inner of the closed loops of the pair and being distant from the inner of the closed loops. The magnet poles which face the backside of the target arrangement and which are arranged along one of the closed loops of the pair have opposite magnet polarity with respect to polarity of the magnet poles facing the backside and arranged along the other of the closed loops of the pair.

The magnet arrangement is subdivided in a first part and in a second part, the outer closed loop of the pair is thereby subdivided in a first outer section on the first part and in a second outer section on the second part and the inner closed loop of the pair is respectively thereby subdivided in a first inner section on the first part and in a second inner section on the second part.

The first outer section is thereby more distant from the rotational axis than the second outer section, both considered in radial direction with respect to the rotational axis.

A displacement drive is operationally interconnected between the first part and the second part.

A HIPIMS supply generator is operationally connected to the target arrangement.

A displacement control unit is operationally connected to the HIPIMS supply generator and to the displacement drive and is adapted to control the displacement drive in dependency of operation time of the HIPIMS supply generator upon the target so as to move the first part more apart from the backside of the target than the second part is moved apart from the backside.

In a good embodiment of the system according to the present invention the pivoting or rotating drive and the displacement drive are both stationarily mounted with respect to the target arrangement.

Additional embodiments of the system according to the invention may be derived from the different embodiments of the method according to the invention.

By the present invention under all its aspects it becomes possible to control the current pulse peak values over the entire HIPIMS operating time of a target, especially to hold such values at least approximately constant.

Thus, the solution departs most generically from a magnet arrangement with axial adjustment parts thereof as described e.g. in the EP_01908090_B1, but is adapted for HIPIMS sputtering by the inner part being e.g. axially stationary whereas the outer part being retracted from the target backside (i.e. increasing the distance of the outer part of the magnet arrangement to the backside of the target) over the target life, i.e. during HIPIMS operation time of the target. In a first approximation such retraction may equal the erosion depth of the target.

The invention will now be further exemplified with the help of figures.

Figure 3:
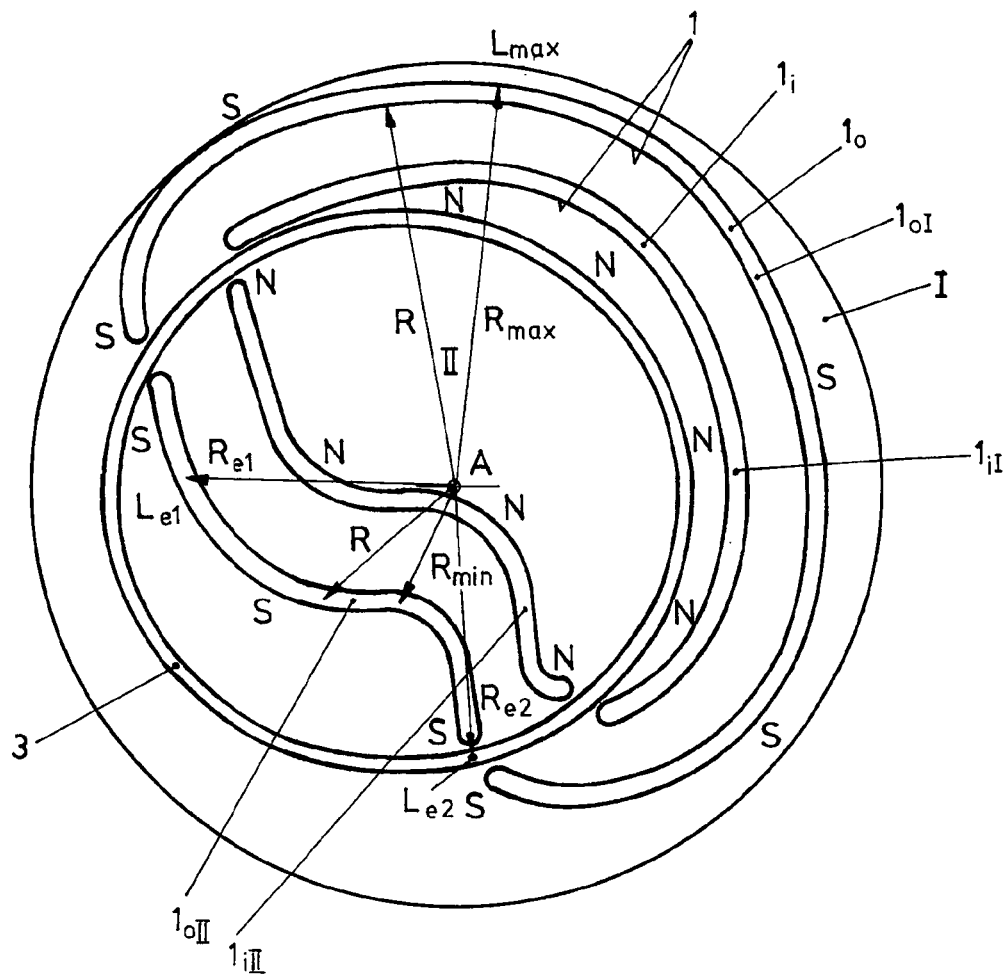
Figure 4B:
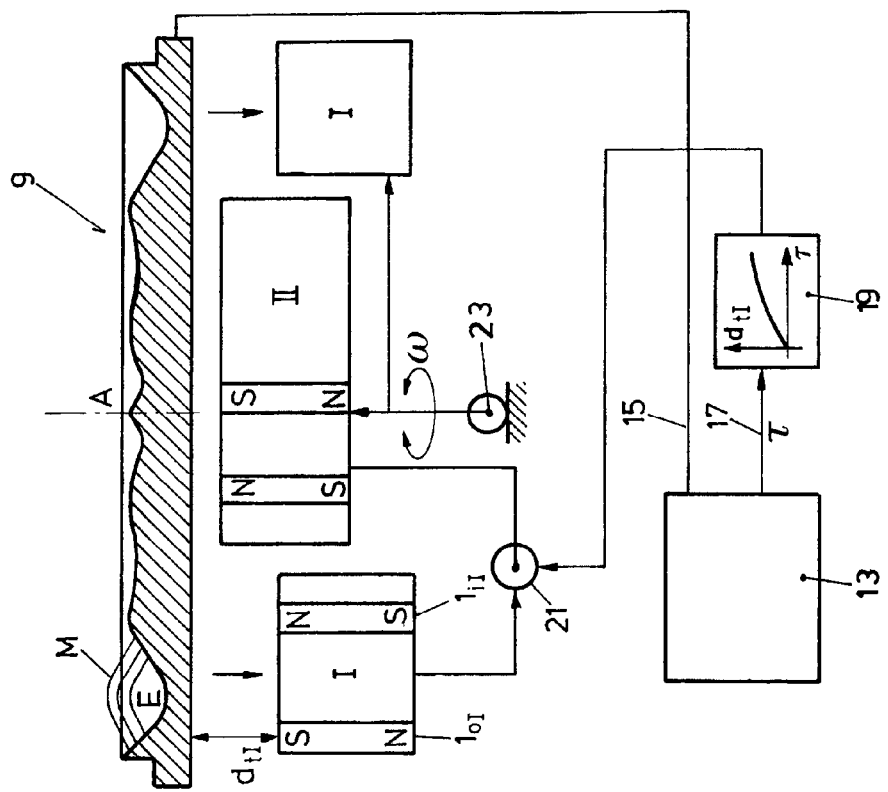
Figure 4A:
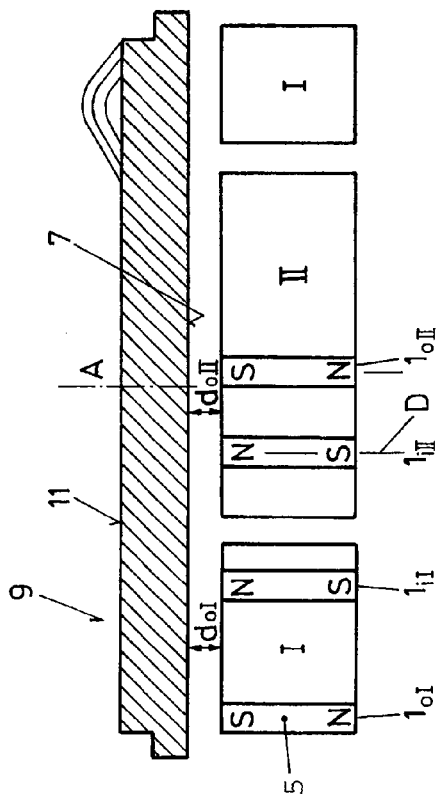
Figure 5:
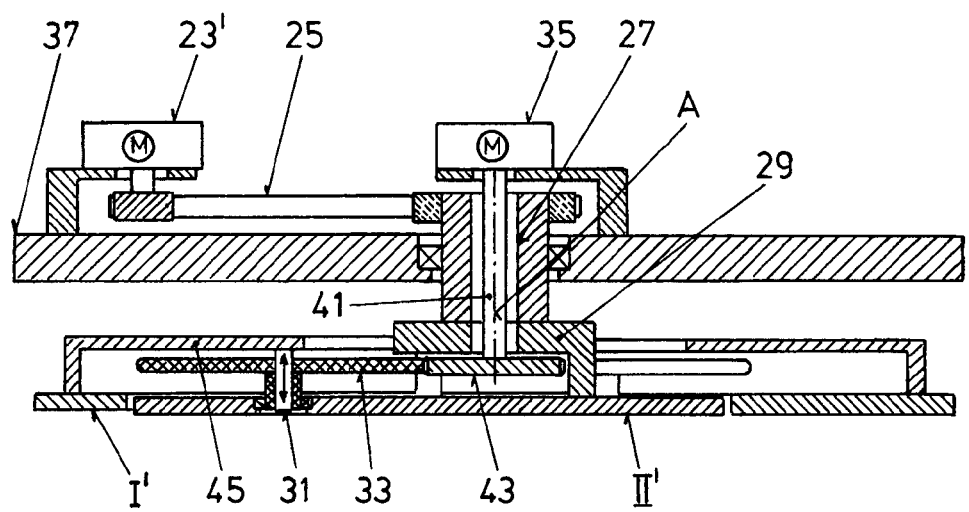
Figure 6:
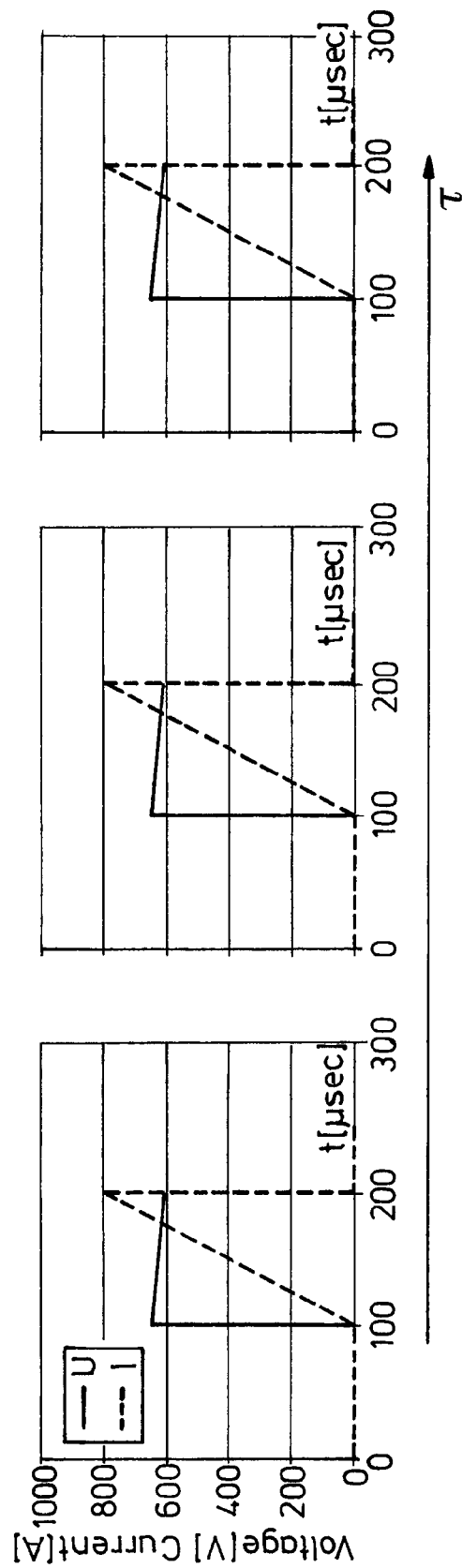

The figures show:

FIG. 1: the current rise as a function of applied target voltage for HIPIMS sputter coating and with 100 μsec pulses;

FIG. 2: the evolution of current pulses for a HIPIMS sputter coating process with 100 μsec pulse length over target life and at constant distance between target backside and magnet arrangement, whereby the pulse voltage is kept constant and the peak current value reaches arc detection limit of approx. 950 A close to target life end;

FIG. 3: a top view on a magnet arrangement as may be exploited for practicing the present invention;

FIG. 4a: most schematically the initial position of the magnet arrangement according to the present invention with respect to the backside of a HIPIMS sputter target;

FIG. 4b: departing from the representation according to FIG. 4a, the positioning of the magnet arrangement according to the present invention as established as a function of increasing operating time of HIPIMS upon the target and further schematically showing the driving and controlling members by means of schematical and simplified functional block/signal flow representation;

FIG. 5: in a simplified cross-sectional representation, a today practiced drive arrangement for the magnet arrangement and according to the present invention;

FIG. 6: over target life of HIPIMS sputter operation, the voltage and current pulses of HIPIMS at 100 μs pulsating, as inventively achieved.

A target arrangement as may be exploited in the frame of the present invention, i.e. for properly controlling pulse current peak values of HIPIMS operation, is shown in FIG. 3 in top view. The magnet arrangement comprises magnet poles which are arranged along a pair 1 of closed loops, namely of an outer loop $1_o$ and an inner loop $1_i$. The outer loop $1_o$, in fact as a geometric locus, completely surrounds the inner loop $1_i$, in fact a geometric locus as well. The two loops of the pair 1 are mutually distant.

The magnet poles which, as will be apparent from the following description, face the backside of a target arrangement and which are arranged along one of the closed loops, let's say loop $1_o$ of the pair 1, have opposite magnet polarity, as an example S, with respect to the polarity -N- of the magnet poles facing the addressed backside and arranged along the other closed loop, let's say $1_i$, of the pair 1.

As schematically shown in FIG. 3 the addressed poles are arranged along the addressed loop $1_i$, $1_o$ in such a way that the respective poles in fact form a continuous pole surface, but may also be mutually separated or spaced, considered along respective loops.

As schematically shown in FIG. 3 the pair 1 of closed loops $1_o$ and $1_i$ is subdivided in a first part I and in a second part II as by an annular gap 3. The entire magnet arrangement is further rotatably or pivotably mounted about a rotational axis A, perpendicular to the plane of FIG. 3 and is (not shown in FIG. 3) operationally coupled to a pivoting or rotational drive.

By subdividing the pair 1 of loops $1_o$ and $1_i$ into two parts I, II the outer loop $1_o$ is subdivided in a first outer section $1_{oI}$ which resides on the first part I and in a second outer section $1_{oII}$ which resides on the second part II. In analogy the inner closed loop $1_i$ is thereby subdivided in a first inner section $1_{iI}$ residing on the first part I and in a second inner section $1_{iII}$ residing on the second part II.

Each magnet pole or each locus along the first outer section $1_{oI}$ as well as along the second outer section $1_{oII}$ defines with respect to rotational axis A or is radially distant from rotation axis A, by a distance R. The average of this distance R all along the first outer section $1_{oI}$ is larger than the average of that distance R along the second outer section $1_{oII}$. Thus, in fact the outer loop $1_o$ is eccentric with respect to rotational axis A and so is the overall pair of closed loops 1.

Further, the first outer section $1_{oI}$ defines a first locus $L_{max}$ where R is maximum, $R_{max}$.

On the other hand one second locus $L_{min}$ along the second outer section $1_{oII}$ defines for a minimum R, $R_{min}$. The delimitation of the first part I from the second part II of the pair 1 of closed loops is selected as follows: On one side of the first locus $L_{max}$ the first outer section $1_{oI}$ propagates up to an end locus $Le_1$ having a distance $R_{e1}$ from the rotational axis A which is not less than $$R_{e1} = (R_{max} + R_{min})/2.$$

Thus, according to FIG. 3 the left-hand limit $L_{e1}$ of part I is at most there, where the addressed relation prevails, but the $L_{e1}$ may be closer towards $L_{max}$.

The other side limit $L_{e2}$ from the first locus $L_{max}$ is there, where, propagating e.g. to the right-hand and departing from locus $L_{max}$, the first outer section $1_{oI}$ has a distance $R_{e2}$ from the rotational axis A, which is not less than $$R_{e2} = (R_{max} + R_{min})/2.$$

Here too, the addressed limit is the maximum limit for the right-hand extent of the first outer section $1_{oI}$ with respect to the locus $L_{max}$. As may be seen from FIG. 3 the right-hand limit locus $L_{e2}$ is realized or exploited by the exemplary magnet arrangement, whereas the left-hand limit locus $L_{e1}$ is not exploited as the left-hand limit of the first outer section $1_{oI}$ is closer to the first locus $L_{max}$.

By separating the pair 1 of closed loops $1_o$ and $1_i$ in two parts I and II following the addressed limits the magnet arrangement becomes highly suited to perform, in the frame of the present invention, pulse current peak control of HIPIMS operation of the target associated with the addressed magnet arrangement.

Most schematically, FIG. 4a and FIG. 4b show respective cross sections through a target arrangement with associated magnet arrangement as e.g. exemplified with the help of FIG. 3. FIG. 4a shows relative positioning of the magnet arrangement and target backside 7, when the target is new, i.e. not yet sputter eroded, whereas FIG. 4b shows the target eroded by HIPIMS sputter operation and the respective qualitative positioning of the magnet arrangement to cope with the rising current pulse values according to the present invention. Those parts in FIGS. 4a and 4b which accord with the magnet arrangement parts as were presented with the help of FIG. 3 are addressed in FIG. 4 by the same reference numbers.

As may be seen from the FIG. 4 the magnets 5 which provide for the magnet poles N and S respectively according to FIG. 3 and arranged along the respective closed loops and facing backside 7 of the target arrangement 9 with a sputtering surface 11, are arranged, in a good embodiment, with dipole axes D perpendicular to the backside 7 of target arrangement 9.

When the target 9 is uneroded, i.e. new with a substantially plane sputtering surface 11, part I of the magnet arrangement as was exemplified with the help of FIG. 3, assumes an initial distance $d_{oI}$ from the backside 7 of the target arrangement 9. The second part II as well assumes an initial distance $d_{oII}$ from the addressed backside 7 of the target arrangement 9. $d_{oI}$ is, in a good embodiment, equal to $d_{oII}$, which nevertheless is not mandatory. As consumption of the target arrangement 9 proceeds and erosion E (see FIG. 4b) increases, part I of the magnet arrangement is retracted from the backside 7 of the target arrangement 9 as denoted in FIG. 4b by $d_{tI}$. Thereby, the distance of part II with respect to the backside 7 of the target arrangement 9 may be kept constant, thus at a value of $d_{oII}$ or may be increased as well (not shown in FIG. 4), but in any case the increase of distance $d_{tI}$ is larger than the increase of the distance $d_{tII}$ of part II from the addressed backside 7. Please note that both parts I and II as schematically shown in the FIG. 4 are in combination rotated about rotational axis A or are pivoted thereabout as schematically addressed by the arrow ω in FIG. 4b. The representations in FIG. 4a and FIG. 4b are taken at the same angular position of the magnet arrangement with respect to rotational axis A.

In FIG. 4b there is further shown a HIPIMS pulse generator unit 13 which, as schematically shown by line 15, operates the target arrangement 9. As further schematically shown by an output line 17 of HIPIMS pulse generator unit 13 the operation time T of target arrangement 9 under HIPIMS operational condition is sensed and registered. A control unit 19 controls a drive 21 operationally connected between the two parts I and II of the magnet arrangement so as to controllably increase the distance $d_{tI}$ with respect to part II in dependency of the overall HIPIMS operating time T of target arrangement 9.

The characteristic of $d_{tI}$ increase in dependency HIPIMS operating time T of target arrangement 9 is in a good embodiment predetermined by experiments and stored in control unit 19. The drive 23 in FIG. 4b addresses the rotational drive for the overall magnet arrangement with parts I and II.

FIG. 5 shows, as an example, a good design of a magnet arrangement drive system so as to control especially the distance $d_{tI}$ of part I of the magnet arrangement as was exemplified with the help of the FIGS. 3 and 4. A carrier II' for part II of the magnet arrangement is connected to the rotational drive 23' according to drive 23 as schematically shown in FIG. 4b. The drive 23', an electric motor, is drivingly connected by a belt 25 to a hollow shaft 27, which is connected by a member 29 to the carrier II'.

A carrier I' for the part I of the magnet arrangement as was exemplified with the help of the FIGS. 3 and 4 is carried by three spindles 31 upon carrier II'. The three spindles 31 are provided with a 120° angular spacing about rotational axis A.

To each of the spindles 31 a gear wheel 33 is mounted.

There is further provided a lift drive 35 in analogy to drive 21, as schematically shown in FIG. 4b e.g. an electric motor. The drive 35 as well as drive 23' are firmly mounted to a stationary frame part 37.

An axle 41 coaxial to rotational axis A is rotationally driven by drive 35 and is provided at its end, pointing towards carrier II' with a gear wheel or pinion 43. The pinion 43 meshes with the gear wheels 33. When the carrier I' is operated at a constant distance $d_{tI}$ from the backside 7 of the target arrangement 9 as of FIG. 4a, then the pinion 43 is driven by drive 35 with the same angular velocity as carrier II' is driven about rotational axis A by means of drive 23' via belt 25 and hollow shaft 27.

To adjust the distance $d_{tI}$ of the carrier I' and thus of the part I of the magnet arrangement, the pinion 43 is run at a different angular velocity, at a higher one or lower one, which ever direction of movement of carrier I' with respect to carrier II' with the respective parts of the magnet arrangement, is desired. Associated e.g. with carrier I', e.g. mounted on a jacket 45, there is provided a reflector plate (not shown) so as to monitor the axial position of carrier I' by a distance sensor (not shown), e.g. by a laser triangulation sensor.

As noted above the addressed drive system as exemplified by FIG. 5 comprises the two drives for rotational movement about axis A, drive 23' as well as for displacement of carrier I' with respect to carrier II', drive 35, whereby both drives are stationary with respect to a frame 37 and thus to the target with the advantage that the electric connections to the addressed drives are stationary.

It is important to avoid any blocking of the four gear wheels 33,43. Thereby, one must consider the rather heavy weight of the magnets of the magnet arrangement residing on the carriers I' and II' in view of the eccentricity of the overall magnet arrangement with respect to rotational axis A. The two main reasons for such blocking are:

1. Tilt momentum forces between the magnet loaded carrier I' and the housing or frame of the drive system as with respect to frame part 37 or between the two carriers I' and II'.
2. Sticking forces due to the carrier I' running into a stop, defining for a reference distance as of $d_{oI}$ of FIG. 4a as a reference initialization position of carrier I'. Any sticking may require disassembling of the HIPIMS sputtering source and of the magnet drive system as exemplified in FIG. 5. Therefore, the spindles 31, e.g. three of them, are realized by means of ball screw spindles, which as known, provide for low friction, stick-slip-free running and very good repetition accuracy for precise positioning.

The procedure to implement the axial movement characteristic over time of carrier I' as of FIG. 5 and thus of part I of the magnet arrangement over HIPIMS target operation time τ and thus over target lifetime may be established as follows:

1. Connect a target current sensor, e.g. an oscilloscope, to the power line as of line 15 of FIG. 4b, from the HIPIMS generator unit 13 to the target arrangement 9.
2. Start sputtering with a new target arranged.
3. Adjust the process parameters (voltage, gas pressure, pulse repetition rate) to achieve a desired target current pulse peak value.
4. Run several kWhs sputtering from the target.
5. Measure the current pulse peak values. If these values differ from the value measured in step 3, then apply axial drive so as to increase the distance $d_{II}$ of part I of the magnet arrangement (carrier I') so as to re-adjust the current pulse peak value to the set-point (step 3).
6. Repeat this procedure described in step 5 throughout the target life and store the dependency of part I axial position in dependency of running time τ of HIPIMS target operation, resulting in a control characteristic as exemplified in control unit 19 of FIG. 4b. As a rule of first approximation part I of the magnet arrangement and thus carrier I' is to be displaced in axial direction and departing from an initial position by about the same amount as erosion E proceeds adjacent the periphery of the target arrangement 9.

There results over target life of HIPIMS sputter operation a uniform, at least substantially constant current pulse peak value as exemplified in FIG. 6.

By means of the examples as described we have shown an embodiment of the invention as today practiced. Nevertheless, the following is to be considered:

As shown especially in FIG. 4b we have considered that the outer first section $1_{oI}$ of the magnet arrangement as well as the inner first section $1_{iI}$ are displaced, in axial direction as indicated by $d_{II}$ equally and further that the addressed sections have always equal distances to the backside 7 of the target arrangement 9. This may not be mandatory.

Alternatively, the addressed sections may be displaced unequally with respect to the back surface 7 of the target arrangement 9 during HIPIMS operation time τ, which on one hand would weaken the effect of such displacement and on the other hand would shift the apex of the magnetic field M upon the sputtering surface of target arrangement 9.

Further, the two sections may have an initial distance from the backside 7 of the target arrangement which are different, thereby being further displaced by equal or by different amounts.

Still further, it may be advantageous to displace only a predominant number of magnet poles of section $1_{oI}$ and/or of section $1_{iI}$, thereby maintaining the respective distances of the minor number of the addressed poles with respect to the backside of the target arrangement 9 constant or more generically different from the respective distances of the predominant number of the addressed magnet poles. This may be realized e.g. to take in account the varying distances of the magnet poles along the addressed sections from the periphery of the target arrangement 9. Thus, in one area e.g. of the first outer section $1_{oI}$ closer to the periphery of the target arrangement all respective magnet poles may be displaced from the backside 7 of target arrangement 9, whereas some few of the magnet poles in areas of the addressed section more distant from the periphery of the target arrangement 9 may be displaced during HIPIMS operation time of the target arrangement 9 by less than the addressed predominant number.

With an eye on part II of the magnet arrangement the examples which have been described show the carrier II' and thus part II of the magnet arrangement being axially stationary during HIPIMS operation time of the target arrangement 9. This may not be mandatory.

All or at least a part of the magnet poles upon carrier II' may be displaced too from the backside 7 of target arrangement 9 during HIPIMS operation time of the target arrangement 9, but, in any case, less than at least the predominant number of magnet poles along the section $1_{oI}$ and/or $1_{iI}$ are retracted during the addressed lifetime of the target.

Further, the magnet poles along the second outer section $1_{oII}$ and/or along the second inner section $1_{iII}$ may have, as described in the example, equal distances with respect to the backside 7 of target arrangement 9 irrespective whether displaced or not displaced during the HIPIMS operation time of the target arrangement 9. A minor number of the addressed magnet poles of part II of the magnet arrangement may be displaced differently from the backside 7 of target arrangement 9 than the predominant number of the addressed poles along the section $1_{oII}$ and/or section $1_{iII}$. Within the frame of the invention it is generically essential that the predominant part of magnet poles arranged along the first outer and/or first inner sections $1_{oI}$, $1_{iI}$, are moved by larger amounts from the backside of the target arrangement 9 than at least a predominant number of magnet poles along the second outer section and/or the second inner section $1_{iII}$, $1_{oII}$ are moved or displaced from the backside of the target arrangement 9 during HIPIMS operation time of the target arrangement 9, and thus during lifetime of such target.

By the present invention it is achieved that current pulse peak values supplied by HIPIMS operation of the target may be properly controlled during lifetime of the target considered and may especially be controlled to be substantially constant over the addressed lifetime.

OVERVIEW MAGNET ARRANGEMENT-REFERENCES

Part I
Part II
Carrier I'
Carrier II'
First outer section $1_{oI}$
Second outer section $1_{oII}$
First inner section $1_{iI}$
Second inner section $1_{iII}$
Outer closed loop $1_o$
Inner closed loop $1_i$
Pair of loops 1

What is claimed is:

1. A method of High-Power Impulse Magnetron Sputtering ("HIPIMS") for coating substrates comprising
   providing a target with a sputtering surface and with a back surface
   providing along said back surface a magnet arrangement
   pivoting or rotating said magnet arrangement about a rotational axis which is perpendicular to said back surface
   wherein said magnet arrangement comprises magnet poles arranged along a pair of closed loops, an outer of said closed loops of said pair completely surrounding an inner of said closed loops of said pair and being distant from said inner of said closed loops,
   the magnet poles facing said back surface and arranged along one of said closed loops of said pair having opposite magnet polarity with respect to the magnet poles facing said back surface and arranged along the other of said closed loops of said pair, wherein said pair of closed loops is subdivided in a first part and in a second part, said outer closed loop of said pair thereby being subdivided in a first outer section in said first part and in a second outer section in said second part and said inner closed loop of said pair being thereby subdivided in a first inner section in said first part and in a second inner section in said second part, said first outer section being more distant from said rotational axis than said second outer section, both considered in radial direction with respect to said rotational axis, said method comprising controllably increasing distances of at least a predominant number of magnet poles along at least one of said outer and of said inner first sections to said back surface more than increasing distances to said back surface of at least a predominant number of magnet poles of said outer and of said inner second sections, as HIPIMS operation time of said target increases, controlling current pulse peak values supplied by the HIPIMS operation of the target, and performing said controllably increasing said distances of said at least predominant number of magnet poles along at least one of said outer and of said inner first sections so as to maintain substantially constant peak current pulse values of said HIPIMS operation over a lifetime of said target.

2. The method of claim 1, wherein said magnet arrangement comprises a single pair of said closed loops.

3. The method of claim 1, wherein said distances to said back surface of said at least predominant number of magnet poles of said outer and of said inner second sections are increased by an equal movement considered in direction from said back surface and parallel to said rotational axis.

4. The method of claim 1, wherein said distances to the back surface of said at least predominant number of magnet poles of said outer and of said inner second sections are kept constant during HIPIMS operation time of said target.

5. The method of claim 1, wherein the distances of said at least predominant number of magnet poles of said outer and of said inner second sections are equal during said HIPIMS operation time of said target.

6. The method of claim 1, wherein controllably increasing said distances of said at least predominant number of magnet poles along at least one of said outer and of said inner first sections to the back surface is performed upon magnet poles along said outer and along said inner first sections.

7. The method of claim 1, wherein the distances of said at least predominant number of magnet poles along at least one of said outer and of said inner first sections are equally increased.

8. The method of claim 1, wherein said distances to said back surface of said at least predominant number of magnet poles of said at least one of said outer and of said inner first sections are increased by an equal movement considered in direction from said back surface and parallel to said rotational axis.

9. The method of claim 1, wherein said distances to said back surface of said at least predominant number of magnet poles of said at least one of said outer and of said inner first sections are equal during HIPIMS operation time of said target.

10. The method of claim 1, wherein said distances of magnet poles along said outer and inner first sections are equal during HIPIMS operation time and wherein distances from magnet poles along said outer and said inner second sections are equal as well during HIPIMS operation time of said target.

11. The method of claim 1, wherein an average distance from said rotational axis of magnet poles along said first outer section is larger than an average distance from said rotational axis of magnet poles along said second outer section.

12. The method of claim 1, comprising controllably increasing distances of all magnet poles along at least one of said outer and of said inner first sections to said back surface.

13. The method of claim 12, comprising controllably increasing said distances of said magnet poles along said outer as well as along said inner first sections to the back surface.

14. The method of claim 1, wherein a first locus along said outer first section defines for a maximum distance $R_{max}$ from said rotational axis and wherein a second locus along the outer second section defines for a minimum distance $R_{min}$ from said rotational axis and wherein said first part is limited on one side of said first locus by a first limit locus which has a distance $R_{e1}$ from said rotation axis which is not less than $$R_{e1} = (R_{max} + R_{min})/2$$

and wherein said first part is limited on the other side of said first locus by a second limit locus with a distance $R_{e2}$ from said rotation axis which is not less than $$R_{e2} = (R_{max} + R_{min})/2.$$

15. The method of claim 1, wherein controllably increasing said distances of said at least predominant number of magnet poles along said at least one of said outer and of said inner first sections to the back surface is performed at least one of stepwise and of steadily during said HIPIMS operation time of said target.

16. The method of claim 1, wherein controllably increasing said distances of said at least predominant number of magnet poles along at least one of said outer and of said inner first sections is performed in dependency of erosion depth of said sputtering surface adjacent to the periphery of said target and is preferably selected approximately equal to the erosion depth of said sputtering surface adjacent said periphery of said target.

17. The method of claim 1, wherein controllably increasing said distances of said at least predominant number of magnet poles along at least one of said outer and of said inner first sections is controlled by a predetermined distance vs. time characteristic.

18. The method of claim 1, wherein said magnet poles are magnet poles of magnets arranged with their dipole directions at least substantially parallel to said rotational axis.

19. A High-Power Impulse Magnetron Sputtering ("HIPIMS") system comprising a target arrangement with a sputtering surface and a back surface a magnet arrangement along said back surface a pivoting or rotating drive operationally connected to said magnet arrangement to pivot or rotate said magnet arrangement about a rotational axis perpendicular to said back surface said magnet arrangement comprising magnet poles arranged along a pair of closed loops, an outer of said closed loops of said pair completely surrounding an inner of said closed loops of said pair and being distant from said inner of said closed loops the magnet poles facing said back surface and arranged along one of said closed loops of said pair having opposite magnet polarity with respect to the magnet poles facing said back surface and arranged along the other of said closed loops of said pair wherein said magnet arrangement is subdivided in a first part and in a second part, said outer closed loop of said pair thereby being subdivided in a first outer section on said first part and in a second outer section on said second part, and said inner closed loop of said pair being thereby subdivided in a first inner section on said first part and in a second inner section on said second part said first outer section being more distant from said rotational axis than said second outer section, both considered in radial direction with respect to said rotational axis a displacement drive operationally interconnected between said first part and said second part a HIPIMS supply generator operationally connected to said target, and a displacement control unit operationally connected to said HIPIMS supply generator and to said displacement drive and adapted to control said displacement drive in dependency of operation of said HIPIMS supply generator upon said target so as to move said first part more from said back surface of said target than said second part is moved from said back surface, wherein the HIPIMS system is configured to control current pulse peak values supplied by the operation of said HIPIMS supply generator upon the target by the displacement control unit being configured to control the displacement drive to controllably increasing distances of at least predominant number of magnet poles along at least one of said outer and of said inner first sections so as to maintain substantially constant peak current pulse values of said HIPIMS operation over a lifetime of said target.

20. The sputter system of claim 19, wherein said pivoting or rotating drive and said displacement drive are both stationarily mounted with respect to said target arrangement.

21. The method of claim 1, wherein said controlling current pulse peak values supplied by the HIPIMS operation of the target comprises adjusting voltage, gas pressure, and pulse repetition rate.

* * * * *